United States Patent
Guo et al.

(10) Patent No.: US 11,388,820 B2
(45) Date of Patent: Jul. 12, 2022

(54) DRIVING CIRCUIT BOARD AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Junjie Guo, Beijing (CN); Zhihua Sun, Beijing (CN); Shulin Yao, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/887,308

(22) Filed: May 29, 2020

(65) Prior Publication Data

US 2021/0168937 A1    Jun. 3, 2021

(30) Foreign Application Priority Data

Nov. 29, 2019   (CN) .......................... 201922114466.5

(51) Int. Cl.
| | |
|---|---|
| H05K 1/14 | (2006.01) |
| H01R 12/62 | (2011.01) |
| H05K 1/18 | (2006.01) |
| H05K 1/11 | (2006.01) |
| G02F 1/133 | (2006.01) |
| H01L 27/32 | (2006.01) |
| G02F 1/1345 | (2006.01) |

(Continued)

(52) U.S. Cl.
CPC ......... *H05K 1/147* (2013.01); *G02F 1/13306* (2013.01); *G02F 1/13452* (2013.01); *H01L 27/3276* (2013.01); *H01R 12/62* (2013.01); *H05K 1/118* (2013.01); *H05K 1/189* (2013.01); *G02B 6/0091* (2013.01); *G02F 1/1368* (2013.01); *H05K 2201/10128* (2013.01); *H05K 2201/10136* (2013.01)

(58) Field of Classification Search
CPC ........ H05K 1/147; H05K 1/189; H05K 1/118; H05K 2201/10128; H05K 2201/10136; H01R 12/62; G02F 1/13306; G02F 1/13452; G02F 1/1368; H01L 27/3276; G02B 6/0091
USPC ................ 361/749–750, 767, 775–784, 803; 174/254–262; 349/349–151
See application file for complete search history.

(56) References Cited

U.S. PATENT DOCUMENTS 7,599,193 B2 * 10/2009 Park ................... H01L 23/4985
                                                                361/783
8,885,350 B2 * 11/2014 Liu ................... G02F 1/133385
                                                                361/749

(Continued)

FOREIGN PATENT DOCUMENTS

EP          3457822 A1 *   3/2019   ....... H01L 23/49838

*Primary Examiner* — Tuan T Dinh
(74) *Attorney, Agent, or Firm* — McDermott Will & Emery LLP

(57) ABSTRACT

A driving circuit board includes: a circuit connection board having a first surface and a second surface that is opposite to the first surface in a thickness direction of the circuit connection board; at least one driver integrated circuit (IC) disposed on the first surface of the circuit connection board; and a printed circuit board assembly (PCBA) bonded to the second surface of the circuit connection board.

11 Claims, 8 Drawing Sheets

(51) Int. Cl.
*G02F 1/1368* (2006.01)
*F21V 8/00* (2006.01)

(56) References Cited

U.S. PATENT DOCUMENTS

| | | | |
|---|---|---|---|
| 9,241,407 B2* | 1/2016 | Ha | H01L 23/49524 |
| 2002/0048152 A1* | 4/2002 | Kurihara | G02F 1/13452 |
| | | | 361/704 |
| 2003/0020152 A1* | 1/2003 | Inoue | H01L 23/552 |
| | | | 257/684 |
| 2005/0088830 A1* | 4/2005 | Yumoto | H05K 1/147 |
| | | | 361/749 |
| 2010/0085334 A1* | 4/2010 | Kim | H01J 11/46 |
| | | | 345/204 |
| 2014/0085281 A1* | 3/2014 | Lim | G09G 3/3291 |
| | | | 345/206 |
| 2014/0307396 A1* | 10/2014 | Lee | G02F 1/13452 |
| | | | 361/749 |
| 2016/0049356 A1* | 2/2016 | Jung | H05K 1/189 |
| | | | 257/774 |
| 2016/0363795 A1* | 12/2016 | Jeon | G02F 1/1339 |
| 2018/0146572 A1* | 5/2018 | Park | G02F 1/13452 |
| 2019/0014669 A1* | 1/2019 | Ahn | H05K 5/0017 |
| 2019/0227385 A1* | 7/2019 | Ahn | G02F 1/133528 |
| 2019/0373719 A1* | 12/2019 | Lee | H01L 51/5284 |
| 2020/0168581 A1* | 5/2020 | Jang | H01L 22/20 |
| 2020/0402433 A1* | 12/2020 | Kim | G01R 31/2884 |

* cited by examiner

DRIVING CIRCUIT BOARD AND DISPLAY APPARATUS

CROSS-REFERENCE TO RELATED APPLICATION

This application claims priority to Chinese Patent Application No. 201922114466.5, filed on Nov. 29, 2019, which is incorporated herein by reference in its entirety.

TECHNICAL FIELD

The present disclosure relates to the field of display technologies, and in particular, to a driving circuit board and a display apparatus.

BACKGROUND

With the development of display technology, light weight, small thickness and narrow bezel are increasingly being pursued by the industry in the design of liquid crystal display (LCD) apparatuses and organic light-emitting diode (OLED) display apparatuses.

SUMMARY

In one aspect, a driving circuit board is provided. The driving circuit board includes a circuit connection board, at least one driver integrated circuit (IC) and a printed circuit board assembly (PCBA). The circuit connection board has a first surface and a second surface that is opposite to the first surface in a thickness direction of the circuit connection board. The at least one driver IC is disposed on the first surface of the circuit connection board. The PCBA is bonded to the second surface of the circuit connection board.

In some embodiments, the circuit connection board has a first region, a second region, and a third region located between the first region and the second region. The second region is closer to the PCBA than the first region. The circuit connection board includes a plurality of first pads disposed in the first region and a plurality of second pads disposed in the second region. Surfaces of the plurality of first pads facing away from the second surface are within the first surface, and surfaces of the plurality of second pads facing away from the first surface are within the second surface. The at least one driver IC is located in the third region, and the PCBA is bonded to the circuit connection board via the plurality of second pads.

In some embodiments, along a first direction that is a direction from the second region to the first region or a direction from the first region to the second region, the PCBA is within a region from a first side face of the circuit connection board to a second side face of the circuit connection board that is opposite to the first side face.

In some embodiments, the second region is closer to the second side face of the circuit connection board than the first region, and one side face of the PCBA closest to the second side face of the circuit connection board along the direction from the first region to the second region is flush with the second side face of the circuit connection board.

In some embodiments, a distance from the first side face of the circuit connection board to the second side face of the circuit connection board along the first direction is in a range of approximately 15 mm to approximately 21 mm.

In some embodiments, the circuit connection board is a flexible printed circuit.

In some embodiments, the PCBA includes: a printed circuit board, a timing controller disposed on a surface of the printed circuit board facing the circuit connection board, and a power management integrated circuit (PMIC) disposed on the surface of the printed circuit board facing the circuit connection board. The timing controller is configured to convert an image data signal into a signal suitable for the driver IC and output the signal to the driver IC. The PM IC is configured to provide operating voltages.

In another aspect, a display apparatus is provided. The display apparatus includes a display panel and the driving circuit board as described above. The display panel includes an array substrate and a first substrate. The driving circuit board is bonded onto a surface of the array substrate facing the first substrate.

In some embodiments, the circuit connection board has a first region, a second region, and a third region located between the first region and the second region, and the second region is closer to the PCBA than the first region. The circuit connection board includes a plurality of first pads disposed in the first region, and a plurality of second pads disposed in the second region; surfaces of the plurality of first pads facing away from the second surface is within the first surface, and surfaces of the plurality of second pads facing away from the first surface is within the second surface; and the at least one driver IC is located in the third region. The display panel has a display region and a peripheral region, and the peripheral region includes a bonding region. The display panel includes a plurality of bonding portions located in the bonding region, and the circuit connection board is electrically connected to the plurality of bonding portions through the plurality of first pads. The second region and the third region of the circuit connection board are both located outside the display panel.

In some embodiments, along a first direction that is a direction from the second region to the first region or a direction from the first region to the second region, a length of a portion of the circuit connection board that exceeds the display panel is in a range of approximately 14 mm to approximately 20 mm.

In some embodiments, the display apparatus further includes a system main board electrically connected to the PCBA. The PCBA includes a timing controller and a power management integrated circuit (PMIC). The system main board is configured to provide an image data signal to the timing controller and a power supply voltage to the PMIC.

In some embodiments, the system main board is located at a side of the circuit connection board away from the PCBA in the thickness direction of the circuit connection board.

In some embodiments, the display panel is a liquid crystal display (LCD) panel or an organic light-emitting diode (OLED) display panel.

In some embodiments, the display panel is the LCD panel. The display apparatus further includes a backlight module disposed at a side of the array substrate away from the first substrate in a thickness direction of the array substrate.

In some embodiments, the backlight module includes a light source and a light guide plate, and the light source is located at a side face of the light guide plate along a direction perpendicular to a thickness direction of the light guide plate.

BRIEF DESCRIPTION OF THE DRAWINGS

In order to describe technical solutions in the embodiments of the present disclosure more clearly, accompanying drawings to be used in some embodiments of the present disclosure will be introduced briefly. However, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations to an actual size of a product, an actual process of a method or an actual timing of signals in the embodiments of the present disclosure.

Figure 1:
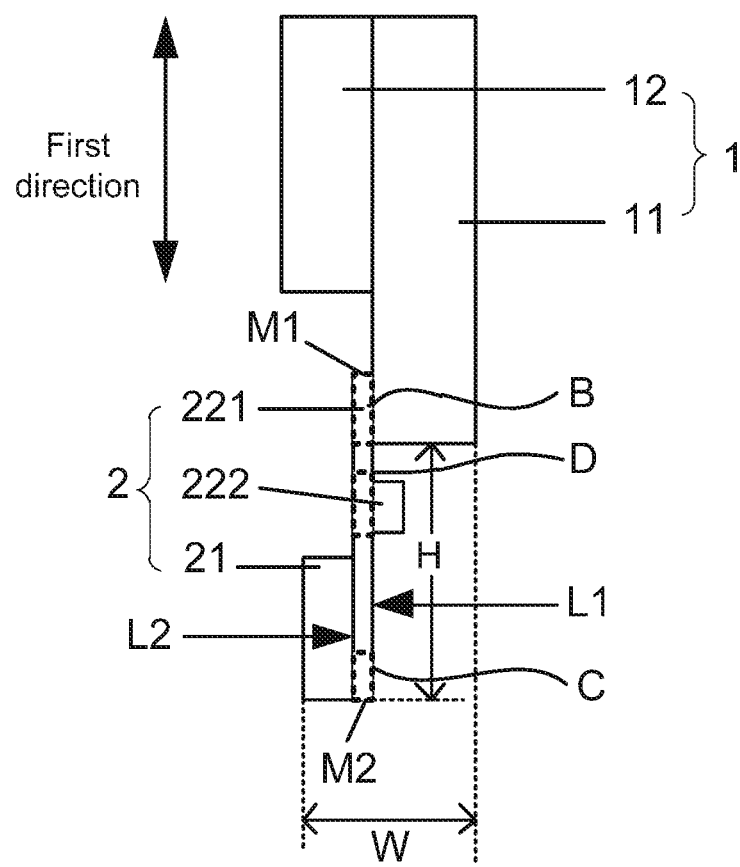
FIG. 1 is a schematic side view of a display apparatus, according to some embodiments.

Exemplary embodiments are described herein with reference to cross-sectional views and/or plan views that are idealized and exemplary drawings. In the drawings, thicknesses of layers and regions may be enlarged for clarity. Therefore, it may be conceived that shapes in the drawings can be correspondingly modified due to fabrication technologies and/or tolerances. Exemplary embodiments should not be construed as being limited to the shapes of the regions shown herein, and shall include, for example, deviations of shapes caused by fabrication. For example, a region illustrated as a rectangle will generally have curved features. Therefore, the regions illustrated in the drawings are schematic and their shapes are not intended to illustrate the actual shapes of the regions of an apparatus and are not intended to limit the scope of the exemplary embodiments.

DETAILED DESCRIPTION

Technical solutions in some embodiments of the present disclosure will be described clearly and completely with reference to accompanying drawings. Obviously, the described embodiments are merely some but not all of the embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" in the specification and the claims are interpreted as open and inclusive, meaning "including, but not limited to." In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials or characteristics may be included in any one or more embodiments or examples in any suitable manner.

Below, terms such as "first" and "second" are only used for descriptive purposes and are not to be construed as indicating or implying the relative importance or implicitly indicating the number of indicated technical features. Therefore, a feature defined by "first" or "second" may include one or more of the features, either explicitly or implicitly. In the description of the embodiments of the present disclosure, the term "a/the plurality of" means two or more unless otherwise specified.

In the description of some embodiments, the term "connected" and its derivatives may be used. For example, the term "connected" may be used in the description of some embodiments to indicate that two or more components are in direct physical or electrical contact with each other. However, the term "connected" may also mean that two or more components are not in direct contact with each other but still cooperate or interact with each other. The embodiments disclosed herein are not necessarily limited to the content herein.

Orientations or positional relationships indicated by terms "center", "upper", "lower", "front", "rear", "left", "right", "vertical", "horizontal", "top", "bottom", "inner", "outer", etc. are based on orientations or positional relationships shown in the drawings, merely to facilitate and simplify the description of the present disclosure, rather than to indicate or imply that the referred devices or elements must have a particular orientation, or must be constructed or operated in a particular orientation. Therefore they should not be construed as limitations to the present disclosure.

"Approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Figure 2:
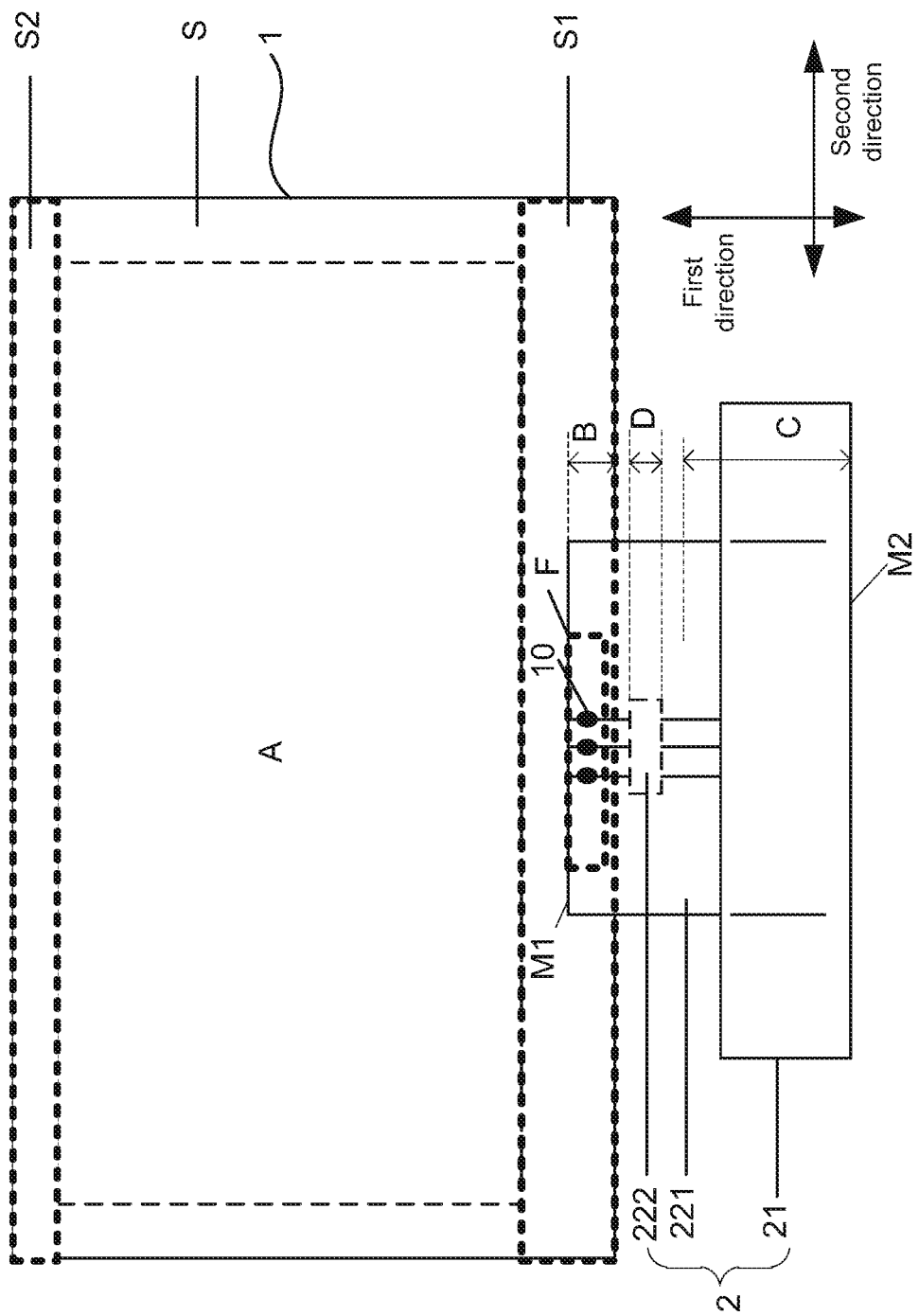
FIG. 2 is a schematic front view of a display apparatus, according to some embodiments.
Figure 3:
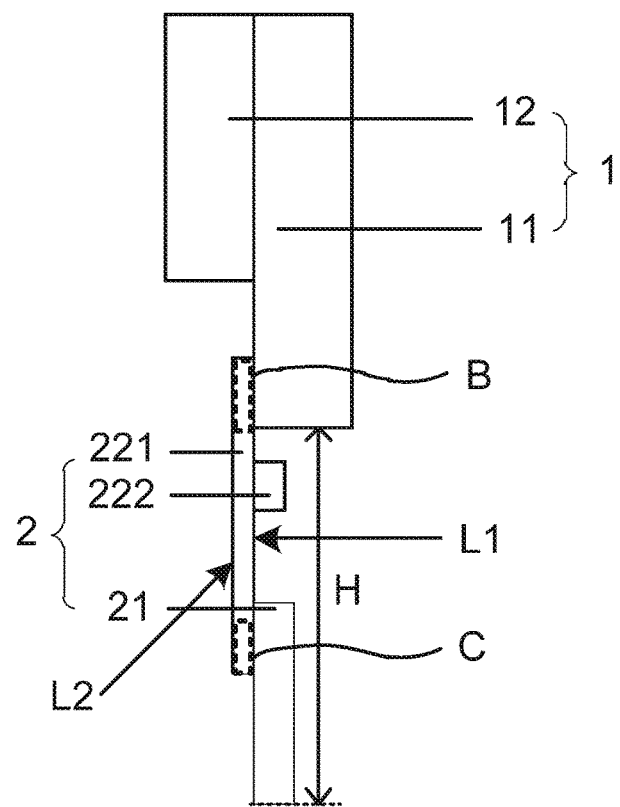
FIG. 3 is a schematic side view of another display apparatus, according to some embodiments.

As shown in FIGS. 1 to 3, the display apparatus includes a display panel 1 and a driving circuit board 2 connected to the display panel 1. The driving circuit board 2 is configured to drive the display panel 1 to display images.

As shown in FIGS. 1 to 3, the driving circuit board 2 includes a circuit connection board 221, at least one driver integrated circuit (IC) 222 disposed on a first surface L1 of the circuit connection board 221, and a printed circuit board assembly (PCBA) 21 disposed on the circuit connection board 221.

The circuit connection board 221 is bonded to the display panel 1, and serves to connect both the PCBA 21 and the at least one driver IC 222 and the display panel 1. For example, the circuit connection board 221 is bonded to the display panel 1 by a pressing process.

The at least one driver IC 222 may be soldered on the first surface L1 of the circuit connection board 221. After the circuit connection board 221 is bonded to the display panel 1, a signal output by the at least one driver IC 222 may be transmitted to the display panel 1 through the circuit connection board 221.

The number of the at least one driver IC 222 is not limited herein. For example, the at least one driver IC 222 may include one driver IC 222, or a plurality of driver ICs 222.

The driving circuit board 2 may include a plurality of circuit connection boards 221, and each of the plurality of circuit connection boards 221 has a same structure as the circuit connection board 221 described above. Correspondingly, each circuit connection board 221 is bonded to the display panel 1.

The PCBA 21 is electrically connected to the driver IC 222 through the circuit connection board 221 after being bonded to the circuit connection board 221, making it possible for the PCBA 21 to control the driver IC 222 to output corresponding signals to the display panel 1. Meanwhile, the PCBA 21 may also be able to output other signals to the display panel 1 through the circuit connection board 221, so that the display panel 1 is driven to display images.

For example, the driver IC 222 is a source driver IC. The PCBA 21 is configured to output image data signals, control signals, etc. to the driver IC 222, and output clock signals, start signals indicating a start of a frame of an image, output enable (OE) signals, and other signals to the display panel 1. The control signals may include a start horizontal (STH) signal and a clock pulse horizontal (CPH) signal.

After receiving the image data signals and the control signals, the driver IC 222 converts the image data signals into grayscale voltage signals and transmits the grayscale voltage signals to a plurality of data lines in the display panel 1 through the circuit connection board 221. The display panel 1 displays images according to the grayscale voltage signals output by the driver IC 222 and other signals including clock signals, start signals, and OE signals.

As shown in FIG. 3, both the PCBA 21 and the driver IC 222 are usually disposed on the first surface L1 of the circuit connection board 221 to reduce the thickness of the display apparatus. Due to a limited size of the circuit connection board 221, it is impossible to provide ample space for both the driver IC 222 and the PCBA 21. Therefore, the PCBA 21 will exceed a lower edge of the circuit connection board 221 by, for example, a length of approximately 10 mm to approximately 15 mm, and the entire driving circuit board 2 may exceed an edge of the display panel 1 by a length H of approximately 60 mm. As a result, after the display panel 1 and the driving circuit board 2 are assembled into the display apparatus, the display apparatus will have a long bottom bezel, causing a problem of "long chin".

Figure 4:
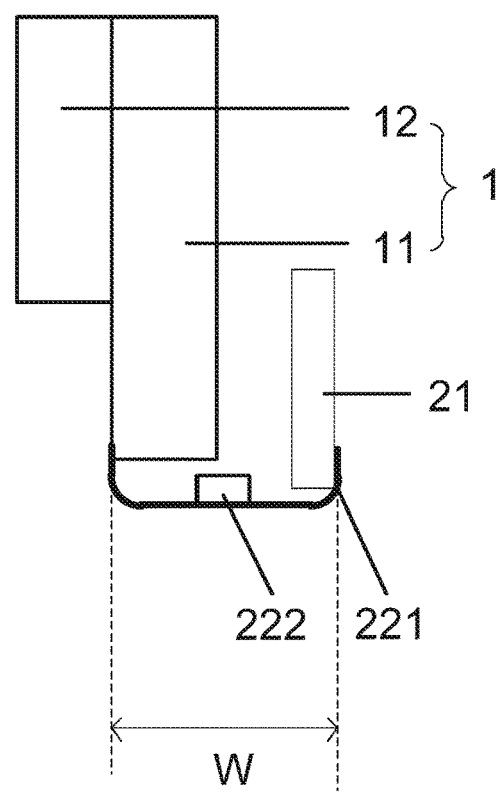
FIG. 4 is a schematic side view of the display apparatus in which the printed circuit board is folded to the back of the display panel based on FIG. 3, according to some embodiments.
Figure 5:
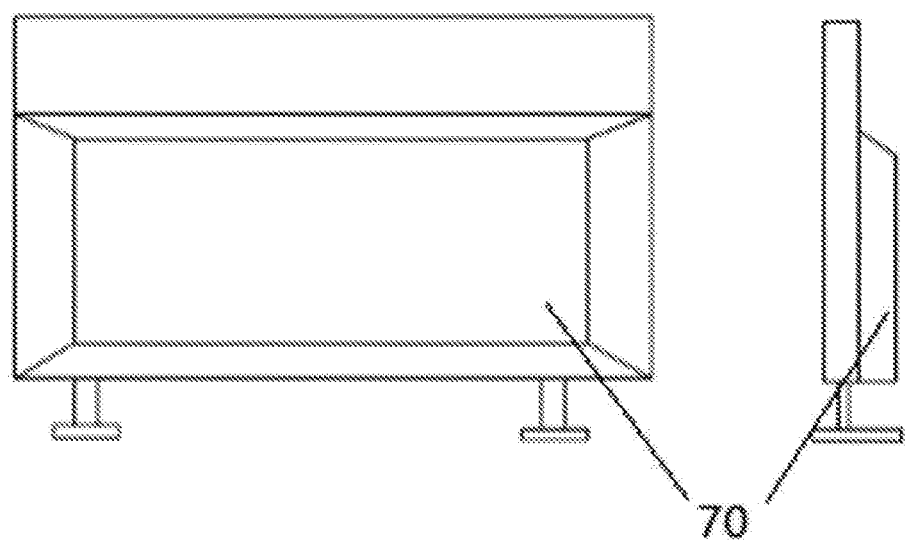
FIG. 5 shows schematic back and side views of the display apparatus based on FIG. 4 after the display apparatus is assembled with a housing, according to some embodiments.

In order to avoid the "long chin" problem, as shown in FIG. 4, the circuit connection board 221 is designed as a flexible printed circuit (FPC), so that the PCBA 21 can be transferred to the back of the display panel 1 (i.e., a side of the display panel 1 away from a display surface) by bending the FPC when the display apparatus is being assembled. For example, the PCBA 21 is transferred to a side of a backlight module in the display apparatus away from the display panel 1 and fixed in a rear case of the display apparatus. However, as shown in FIG. 4, the arrangement of the PCBA 21 in which the PCBA 21 is transferred to the back of the display panel 1 may increase an overall thickness W of the array substrate 11 and the PCBA 21 (i.e., a distance from a surface of the array substrate 11 bonding the circuit connection board 221 to a surface of the PCBA 21 bonding the circuit connection board 221 along a thickness direction of the array substrate 11, as shown in FIG. 4) to approximately 20 mm. In this case, after the display panel 1 and the driving circuit board 2 are assembled together, there will be a large difference between a thickness of a lower portion of the display apparatus (i.e., a portion of the array apparatus provided with the PCBA 21) and a thickness of an upper portion of the display apparatus. As a result, after the rear case 70 of the display apparatus is assembled, the rear case 70 will be protruding as shown in FIG. 5, which is not conducive to manufacturing flat panel display apparatuses.

Herein, the overall thickness W of the array substrate 11 and the PCBA 21 refers to a distance between two furthest surfaces of the array substrate 11 and the PCBA 21 along the thickness direction of the array substrate 11 after the driving circuit board 2 and the display panel 1 are assembled together.

In some embodiments of the present disclosure, as shown in FIGS. 1 and 2, the at least one driver IC 222 is disposed on the first surface L1 of the circuit connection board 221, and the PCBA 21 is bonded to a second surface L2 of the circuit connection board 221 opposite to the first surface L1 along the thickness direction of the circuit connection board 221.

In the driving circuit board 2 provided in some embodiments of the present disclosure, since the driver IC 222 and the PCBA 21 are respectively located on the first surface L1 and the second surface L2 of the circuit connection board 221 that are opposite to each other in the thickness direction of the circuit connection board 221, there is enough space for the PCBA 21 on the second surface L2. Therefore, more portions of the PCBA 21 may be located on the circuit connection board 221 (that is, more portions of the PCBA 21 may overlap the circuit connection board 221). Correspondingly, fewer portions of the PCBA 21 will exceed beyond the circuit connection board 221, thereby avoiding the "long chin" problem of the display apparatus. In this case, in the display apparatus including the driving circuit board 2, the PCBA 21 does not need to be arranged at the back of the display panel 1, and the difference between the thickness of the upper portion and the thickness of the lower portion of the display apparatus may be effectively reduced. In particular, the driving circuit board 2 may be applied to a flat panel display apparatus such as a flat panel television.

In some examples, the PCBA 21 is bonded to the second surface L2 of the circuit connection board 221 by a pressing process.

In some examples, the driving circuit board 2 includes a plurality of circuit connection board 221. The PCBA 21 is bonded to the second surface L2 of each circuit connection board 221.

In some embodiments, the circuit connection board 221 is a FPC. The driver IC 222 may be provided on the FPC to form a Chip on Film (COF).

Herein, although the circuit connection board 221 is the FPC, the circuit connection board 221 is not bent. That is, the PCBA 21 is not arranged at the back of the display panel 1, and is located outside an edge of the display panel 1.

Since the FPC is not bent, the overall thickness W of the array substrate 11 and the PCBA 21 (i.e., as shown in FIG. 1, a distance from a surface of the array substrate 11 facing away from the circuit connection board 221 to a surface of the PCBA 21 facing away from the circuit connection board 221 along a thickness direction of the array substrate 11) may be reduced to approximately 1 mm. As a comparison, the overall thickness W of the array substrate 11 and the PCBA 21 in FIG. 4 is approximately 20 mm.

Of course, in a case where the circuit connection board 221 is not bent, the circuit connection board 221 may also be an ordinary hard circuit board.

In some embodiments, as shown in FIGS. 1, 2, 6A, 6B and 11, the circuit connection board 221 has a first region B, a second region C, and a third region D located between the first region B and the second region C, and the second region C is closer to the PCBA 21 than the first region B.

Figure 6A:
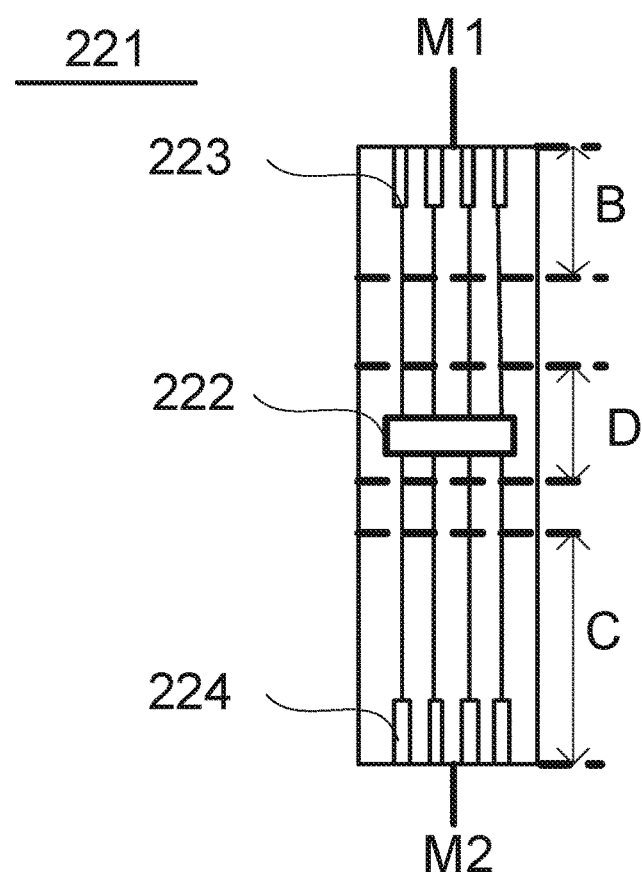
FIG. 6A is a schematic top view of a circuit connection board, according to some embodiments.
Figure 6B:
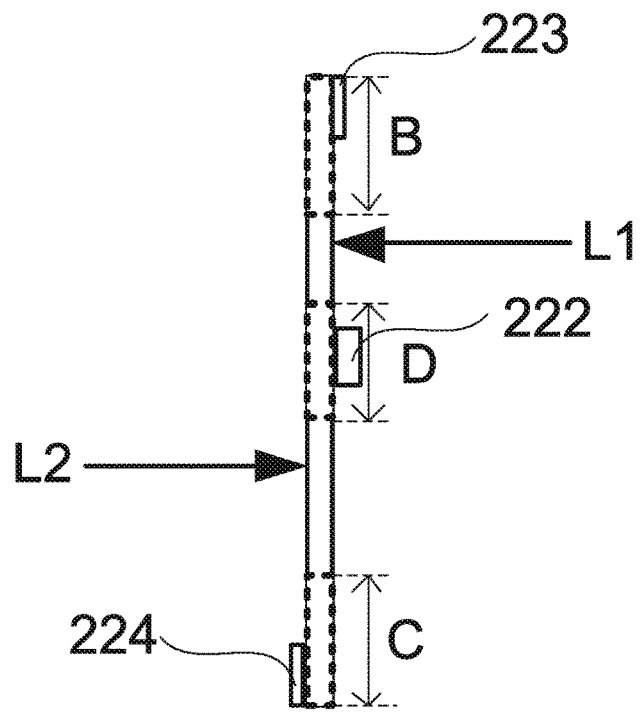
FIG. 6B is a schematic side view of a circuit connection board, according to some embodiments.

In this case, as shown in FIGS. 6A and 6B, the circuit connection board 221 includes: a plurality of first pads 223 provided in the first region B, and a plurality of second pads 224 provided in the second region C. Surfaces of the plurality of first pads 223 facing away from the second surface L2 are within the first surface L1, and surfaces of the plurality of second pads 224 facing away from the first surface L1 are within the second surface L2. The circuit connection board 221 is bonded to the display panel 1 via the plurality of first pads 223, and the circuit connection board 221 is bonded to the PCBA 21 via the plurality of second pads 224. The at least one driver IC 222 is provided on the first surface L1 and located in the third region D.

In some embodiments, as shown in FIGS. 1 and 2, along a first direction, the PCBA 21 does not exceed a first side face M1 and a second side face M2 of the circuit connection board 221 that are opposite to each other. The first direction is a direction from the second region C to the first region B or a direction from the first region B to the second region C.

The PCBA 21 is located on the second surface L2 of the circuit connection board 221 and is bonded to the circuit connection board 221 via the plurality of second pads 224 in the second region C, and the driver IC 222 is located on the first surface L1 of the circuit connection board 221. The PCBA 21 may not only be located in the second region C of the circuit connection board 221, but may also be located in the third region D of the circuit connection board 221. In this case, by arranging that the PCBA 21 does not exceed the first side face M1 and the second side face M2 of the circuit connection board 221 that are opposite to each other along the first direction, in a case where the driving circuit board 2 is applied to a display apparatus, it may be possible to ensure that the entire driving circuit board 2 and the circuit connection board 221 exceed the display panel 1 by a same distance, thereby further avoiding the "long chin" problem.

In this case, as shown in FIG. 2, in a second direction perpendicular to the first direction, the PCBA 21 can exceed a third side face and a fourth side face of the circuit connection board 221 that are opposite to each other. For example, a width of the PCBA 21 in the second direction may be slightly less than a width of the display panel 1 in the second direction. By increasing a lateral dimension of the PCBA 21, an area of the PCBA 21 may be increased, which is conducive for arranging more functional circuits on the PCBA 21.

In some embodiments, as shown in FIG. 1, the second region C is closer to the second side face M2 of the circuit connection board 221 than the first region B. That is, the second side face M2 is a side face of the circuit connection board 221 facing away from the display panel 1. In this case, a side face of the PCBA 21 closest to the second side face M2 of the circuit connection board 221 in the direction from the first region B to the second region C is flush with the second side face M2.

In some embodiments, a distance from the first side face M1 of the circuit connection board 221 to the second side face M2 of the circuit connection board 221 along the first direction is in a range of approximately 15 mm to approximately 21 mm. For example, the distance from the first side face M1 of the circuit connection board 221 to the second side face M2 of the circuit connection board 221 along the first direction is approximately 15 mm, approximately 17 mm, approximately 18 mm, approximately 20 mm, or approximately 21 mm.

As shown in FIG. 4, it can be known from the above description that the circuit connection board 221 may be the FPC, the FPC is usually bent to transfer the PCBA 21 to the back of the display panel 1, and therefore a length of the FPC is generally 40 mm. However, in some embodiments of the present disclosure, as shown in FIG. 1, the circuit connection board 221 is not bent, and therefore the length of the circuit connection board 221 is significantly reduced.

In this case, along the first direction, a dimension of the first region B of the circuit connection board 221 that is bonded to the display panel 1 is approximately 1 mm. Therefore, as shown in FIG. 1, the circuit connection board 221 exceeds the edge of the display panel 1 by a length H in a range of approximately 14 mm to approximately 20 mm. However, as shown in FIG. 3, in the case where the PCBA 21 and the driver IC 222 are disposed on the first surface L1 of the circuit connection board 221, the driving circuit board 2 exceeds the edge of the display panel 1 by a length H of approximately 60 mm. In comparison, in the display apparatus provided in some embodiments of the present disclosure, the length H by which the driving circuit board 2 exceeds the edge of the display panel 1 is significantly reduced.

Figure 7:
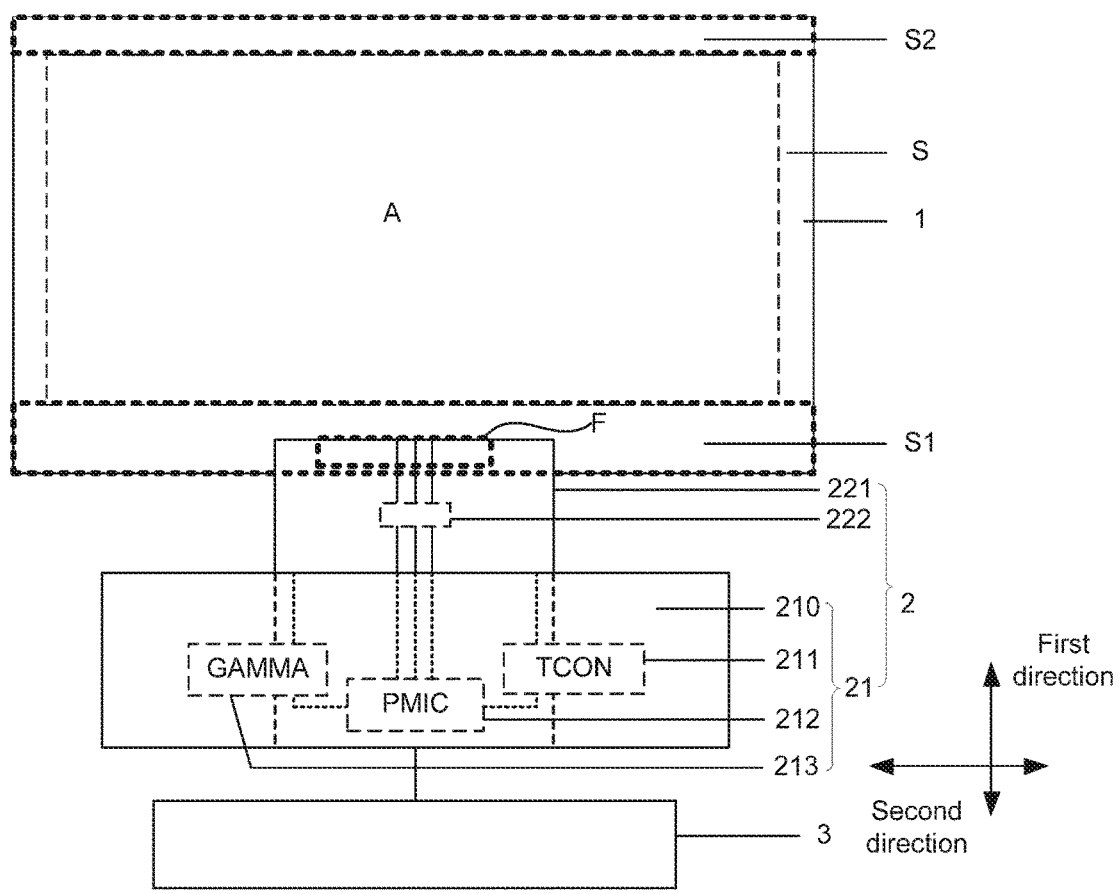
FIG. 7 is a diagram showing a system architecture of a display apparatus, according to some embodiments.

In some embodiments, as shown in FIG. 7, the PCBA 21 includes a printed circuit board (PCB) 210, and a timing controller (TCON) 211, a power management integrated circuit (PMIC) 212, a gamma integrated circuit (GAMMA IC) 213, etc. that are provided on the PCB 210 and located on a surface of the PCB 210 facing the circuit connection board 221. The TCON 211 is configured to convert an image data signal into a signal suitable for the driver IC 222 and output the signal to the driving IC 222; and the PMIC 212 is configured to provide operating voltages to the driving circuit board 2 and the display panel 1. The GAMMA IC 213 is configured to generate a gamma voltage, so that the driver IC 222 processes the received data signal according to the gamma voltage to generate a data voltage signal.

In some embodiments, the display panel 1 may be a liquid crystal display (LCD) panel or an organic light-emitting diode (OLED) display panel. In a case where the display panel 1 is the LCD panel, the display apparatus is a LCD apparatus. In a case where the display panel 1 is the OLED display panel, the display apparatus is an OLED display apparatus.

In some embodiments, as shown in FIG. 2, the display panel 1 includes a display region A and a peripheral region S surrounding the display region A. Sub-pixels are located in the display region A, and the peripheral region S is used for arranging wires. In addition, a gate driving circuit of the display panel 1 is disposed in the peripheral region S.

As shown in FIGS. 1 and 2, the display panel 1 includes an array substrate 11. The description that the circuit connection board 221 in the driving circuit board 2 is bonded to the display panel 1 actually means that the circuit connection board 221 is bonded to a plurality of bonding portions 10 (e.g., pads) located in the peripheral region S of the array substrate 11. In this way, electrical connection is realized between the circuit connection board 221 and a plurality of signal lines connected to the plurality of bonding portions 10.

For example, the plurality of bonding portions 10 are located in a region of the array substrate 11 that is proximate to the bottom bezel of the display panel 1.

Figure 8:
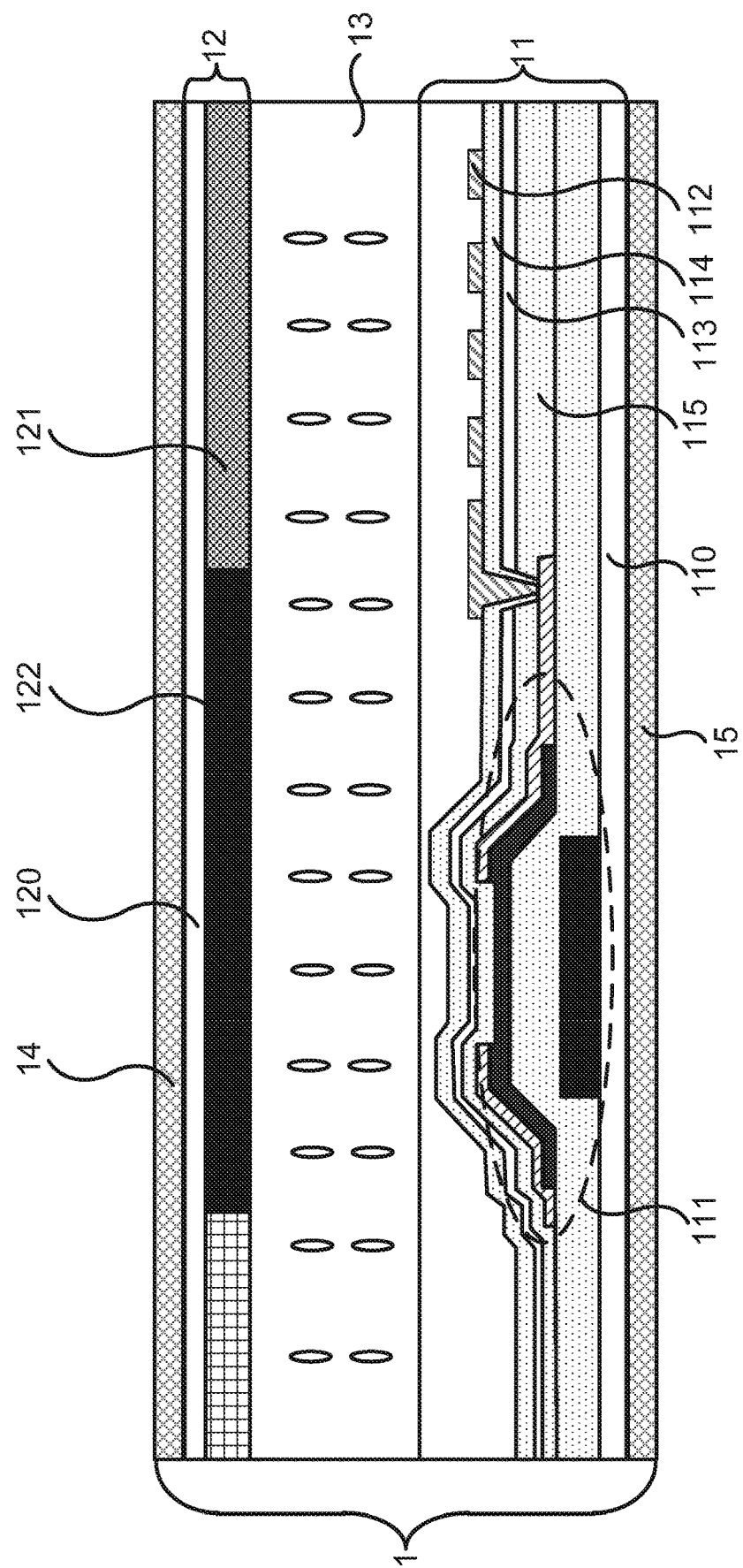
FIG. 8 is a schematic view showing a structure of a liquid crystal display apparatus, according to some embodiments.

In an example where the display panel 1 is the LCD panel, as shown in FIG. 8, the LCD panel includes an array substrate 11, a first substrate 12, and a liquid crystal layer 13 located between the array substrate 11 and the first substrate 12.

For example, as shown in FIG. 8, the array substrate 11 includes a first substrate 110, and a thin film transistor 111 and a pixel electrode 112 provided on the first substrate 110 and located in each sub-pixel in the display region A. The thin film transistor 111 includes an active layer, a source, a drain, and a gate. The array substrate 11 further includes a gate insulating layer disposed between the gate and the active layer. The source and the drain are both in contact with the active layer, and the pixel electrode 112 is electrically connected to the drain of the thin film transistor 111. Since the source and the drain of the thin film transistor 111 are generally symmetrical in structure and composition, there is no difference between the source and the drain. In some embodiments of the present disclosure, in order to distinguish two electrodes other than the gate in the same thin film transistor 111, one electrode is referred to as a source, and another electrode is referred to as a drain. Of course, the thin film transistor 111 in the embodiments of the present disclosure may also be replaced with other electronic components having switching properties.

For example, each row of sub-pixels is electrically connected to a corresponding gate line, and each column of sub-pixels is electrically connected to a corresponding data line.

For example, all the gate lines extend to the peripheral region S and are electrically connected to the gate driving circuit that is located in the peripheral region S and integrated in the array substrate 11. All the data lines extend to the peripheral region S and are connected to some of the plurality of bonding portions 10 in one-to-one correspondence, so as to realize electrical connection between one or more data lines and a corresponding driver IC 222.

The thin film transistor 111 is, for example, a bottom-gate thin film transistor, a top-gate thin film transistor, or a dual-gate thin film transistor. In FIG. 8, the bottom-gate thin film transistor is taken as an example for illustration.

In some examples, as shown in FIG. 8, the array substrate 11 further includes a common electrode 113 disposed above the first substrate 110. For example, the pixel electrode 112 and the common electrode 113 are disposed in a same layer. In this case, the pixel electrode 112 and the common electrode 113 both have a comb structure including a plurality of strip-shaped sub-electrodes. For another example, the pixel electrode 112 and the common electrode 113 are disposed in different layers. In this case, as shown in FIG. 8, the array substrate 11 further includes a first insulating layer 114 provided between the pixel electrode 112 and the common electrode 113. In addition, as shown in FIG. 8, the common electrode 113 is provided between the thin film transistor 111 and the pixel electrode 112, and the array substrate 11 further includes a second insulating layer 115 provided between the common electrode 113 and the thin film transistor 111.

In some other examples, the common electrode 113 is provided in the first substrate 12.

For example, as shown in FIG. 8, the first substrate 12 includes a second substrate 120, and a color filter layer 121 provided on one side of the second substrate 120. In this case, the first substrate 12 may also be referred to as a color filter (CF) substrate. The color filter layer 121 includes at least a filter unit of a first color, a filter unit of a second color, and a filter unit of a third color. Each of the filter unit of the first color, the filter unit of the second color and the filter unit of the third color is located in a sub-pixel. The first color, the second color, and the third color herein are three primary colors, for example, red, green, and blue, respectively. The first substrate 12 further includes a black matrix 122 provided on the second substrate 120. The black matrix 122 is used to separate the filter unit of the first color, the filter unit of the second color, and the filter unit of the third color from each other.

As shown in FIG. 8, the LCD panel 1 further includes an upper polarizer 14 provided on a side of the first substrate 12 away from the liquid crystal layer 13 and a lower polarizer 15 provided on a side of the array substrate 11 away from the liquid crystal layer 13.

Figure 9:
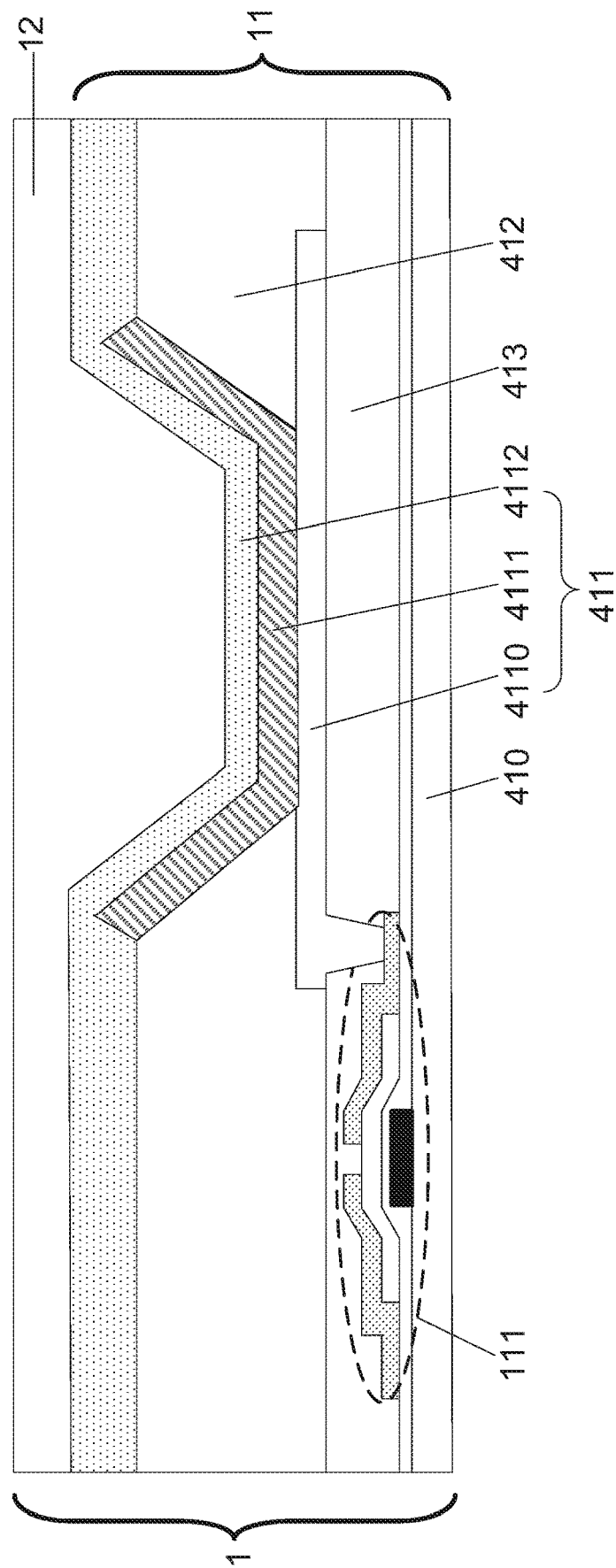
FIG. 9 is a schematic view showing a structure of an OLED display apparatus, according to some embodiments.

In a case where the display panel 1 is the OLED display panel, as shown in FIG. 9, the OLED display panel includes an array substrate 11 and the first substrate 12. The first substrate 12 may be an encapsulating structure, such as a glass plate or a flexible encapsulating layer for encapsulating.

For example, as shown in FIG. 9, the array substrate 11 includes a third substrate 410, and a light-emitting device 411 and a driving circuit that are provided on the third substrate 410 and located in each sub-pixel. The driving circuit includes a plurality of thin film transistors 111, and one of the plurality of thin film transistors 111 is used as a driving transistor. The light-emitting device 411 includes an anode 4110, a light-emitting functional layer 4111, and a cathode 4112. The anode 4110 is electrically connected to the drain of the driving transistor. As shown in FIG. 9, the array substrate 11 further includes a planarization layer 413 provided between the plurality of thin film transistors 111 and the anode 4110.

For example, each row of sub-pixels is electrically connected to a corresponding gate line, and each column of sub-pixels is electrically connected to a corresponding data line.

For example, all the gate lines extend to the peripheral region S and are electrically connected to the gate driving circuit that is located in the peripheral region S and integrated in the array substrate 11. All the data lines extend to the peripheral region S and are connected to some of the plurality of bonding portions 10 in one-to-one correspondence, so as to realize electrical connection between one or more data lines and a corresponding driver IC 222.

In some examples, the light-emitting functional layer 4111 includes a light-emitting layer. In some other examples, in addition to the light-emitting layer, the light-emitting functional layer 4111 further includes at least one of an electron transporting layer (ETL), an electron injection layer (EIL), a hole transporting layer (HTL), or a hole injection layer (HIL).

The light-emitting device 411 is, for example, a bottom emission light-emitting device, a top emission light-emitting device, or a double sided emission light-emitting device. Herein, light emitted from the bottom emission light-emitting device travels in a direction toward the third substrate 410; light emitted from the top emission light-emitting device travels in a direction away from the third substrate 410; and light emitted from the double sided emission light-emitting device includes light traveling towards the third substrate 410 and light traveling away from the third substrate 410.

As shown in FIG. 9, the array substrate 11 further includes a pixel defining layer 412. The pixel defining layer 412 includes a plurality of openings, and each opening corresponds to a light-emitting device 411.

FIG. 7 is a diagram showing a system architecture of a display apparatus. The display apparatus may further include a system main board 3 in addition to the display panel 1 and the driving circuit board 2. The system main board 3 is electrically connected to the PCBA 21 in the driving circuit board 2. The driving circuit board 2 is located between the system main board 3 and the display panel 1.

The PCBA 21 includes the PCB 210, and the TCON 211, the PMIC 212, the gamma integrated circuit (GAMMA IC) 213, etc. that are provided on the PCB 210. The system main board 3 is configured to provide an image data signal to the TCON 211 and provide a power supply voltage to the PMIC 212. The TCON 211 is configured to convert the image data signal into a signal suitable for the driver IC 222. The PMIC 212 is configured to provide operating voltages for the display panel 1 and elements in the driving circuit board 2 other than the PMIC 212. For example, the PMIC 212 is configured to provide operating voltages for the driver IC 222 and the gate driving circuit. The GAMMA IC 213 is configured to generate a gamma voltage, so that the driver IC 222 processes the received data signal according to the gamma voltage to generate a data voltage signal.

In some embodiments, as shown in FIG. 2, the peripheral region S includes a first sub-region S1 and a second sub-region S2 that are disposed at two opposite sides of the display region S respectively along the first direction. The first sub-region S1 includes a bonding region F, and the plurality of bonding portions 10 are provided in the bonding region F. As shown in FIGS. 2 and 6, the circuit connection board 221 is bonded to corresponding bonding portions 10 that are located in the bonding region F of the display panel 1 through the plurality of first pads 223 located in the first region B. The second region C and the third region D of the circuit connection board 221 are both located outside the display panel 1.

That is, as shown in FIG. 2, the first sub-region S1 of the display panel 1 is a region corresponding to the bottom bezel of the display apparatus, and the second sub-region S2 of the display panel 1 is a region corresponding to the top bezel of the display apparatus. The circuit connection board 221 exceeds an edge of the first sub-region S1 away from the second sub-region S2 of the display panel 1 (i.e., a lower edge of the display panel 1) and is bonded to the display panel 1.

In some embodiments, as shown in FIGS. 1 and 2, along the first direction, the PCBA 21 does not exceed the first side face M1 and the second side face M2 of the circuit connection board 221. That is, the PCBA 21 does not exceed both edges of the circuit connection board 221 along the first direction. In this way, the length H by which the driving circuit board 2 exceeds the edge of the display panel 1 may be significantly reduced.

For example, as shown in FIGS. 1 and 2, along the first direction, the side face of the PCBA 21 facing away from the display panel 1 (i.e., a lower edge of the PCBA 21) is flush with the second side face M2 of the circuit connection board 221. In order to further reduce the "long chin" in some embodiments, the length H by which the circuit connection board 221 exceeds the edge of the display panel 1 may be controlled to be within a range of approximately 14 mm to approximately 20 mm. For example, the length H by which the circuit connection board 221 exceeds the edge of the display panel 1 is approximately 14 mm, approximately 15 mm, approximately 16 mm, approximately 17 mm, approximately 19 mm, or approximately 20 mm. Since the PCBA 21 does not exceed the first side face M1 and the second side face M2 of the circuit connection board 221 along the first direction, and a width of an overlapping portion of the circuit connection board 22 and the first sub-region S1 of the display panel 1 along the first direction is generally constant, the length H by which the driving circuit board 2 exceeds the edge of the display panel 1 may be controlled between approximately 14 mm and approximately 20 mm.

In this case, due to reasons regarding the process of the pressing equipment, a dimension of the plurality of first pads 223 along the first direction is approximately 1 mm. As a result, as shown in FIGS. 1, 2 and 6, the distance between the first side face M1 of the circuit connection board 221 and the second side face M2 of the circuit connection board 221 in the first direction is in a range of approximately 15 mm to approximately 21 mm.

Figure 10:
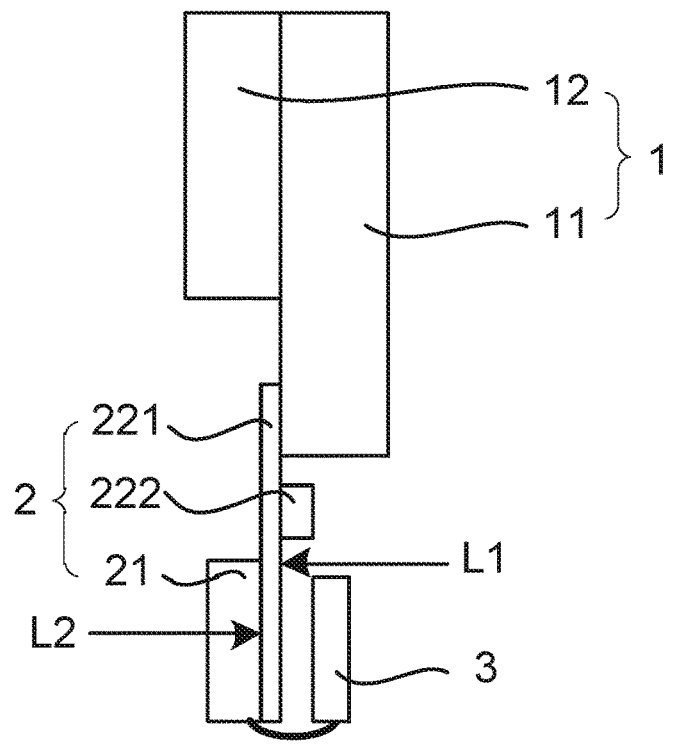
FIG. 10 is a schematic side view of yet another display apparatus, according to some embodiments.

In some embodiments, as shown in FIG. 10, the system main board 3 is located at a side of the circuit connection board 221 away from the PCBA 21 in the thickness direction of the circuit connection board 221.

For example, the system main board 3 is connected to the PCBA 21 through a FPC, and the PCBA 21 is transferred to the side of the circuit connection board 221 away from the PCBA 21 by bending the FPC. It will be noted that, FIG. 10 is an illustration in which there is a distance between the system main board 3 and the circuit connection board 22, but the position relationship between the system main board 3 and the circuit connection board 22 is not limited thereto in some embodiments. For example, the system main board 3 may be in contact with the first surface L1 of the circuit connection board 221.

The PCBA 21 in the driving circuit board 2 is not transferred to the back of the display panel 1, and the overall structure of the driving circuit board 2 and the system main board 3 is located at a side of the first sub-region S1 away from the second sub-region S2 in the first direction. Compared with the structure shown in FIG. 4, in some embodiments of the present disclosure, after the rear case is assembled, there will not be a large difference between the thicknesses of the upper portion and the lower portion of the display apparatus, and the structure in some embodiments of the present disclosure may be applied to the manufacture of flat panel display apparatuses.

For another example, the system main board 3 is independent of the display apparatus. For example, the display apparatus is a TV, the system main board 3 may be provided in a set-top box of the TV, and the TV can be electrically connected to the set-top box through wires.

Figure 11:
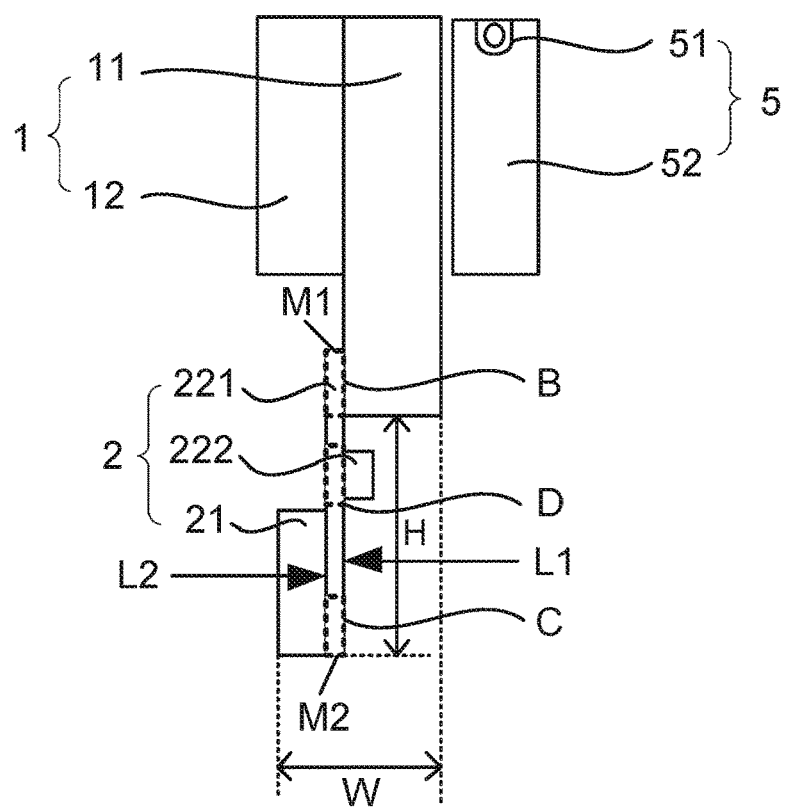
FIG. 11 is a schematic side view of yet another display apparatus, according to some embodiments.

In some embodiments, in a case where the display panel 1 is the LCD panel, the display apparatus is a LCD apparatus. As shown in FIG. 11, the LCD apparatus further includes a backlight module 5. The backlight module 5 is disposed at a side of the array substrate 11 away from the first substrate 12 in a thickness direction of the array substrate 11, and is used to provide backlight for the display panel 1.

In some examples, the PCB 210 is bonded to the circuit connection board 221, and two opposite sides of the PCB 210 along the second direction are fixed to a bracket of the backlight module 5 in the LCD apparatus.

In some examples, as shown in FIG. 11, the display apparatus is an edge-lit display apparatus. That is, the backlight module 5 includes a light source 51 and a light guide plate 52, and the light source 51 is located at a side face of the light guide plate 52 along a direction perpendicular to the thickness direction of the light guide plate 52.

The side-lit display apparatus including the driving circuit board 2 according to some embodiments may have a small thickness, and thus may be applied to a flat panel TV.

In some other examples, the display apparatus is a direct-lit display apparatus. That is, the backlight module 5 includes the light source 51 and the light guide plate 52, and the light source 51 is located at a side of the light guide plate 52 away from the display panel 1 in the thickness direction of the display panel 1.

The forgoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A driving circuit board, comprising:
   a circuit connection board, having a first surface and a second surface that is opposite to the first surface in a thickness direction of the circuit connection board;
   at least one driver integrated circuit (IC) disposed on the first surface of the circuit connection board; and
   a printed circuit board assembly (PCBA) bonded to the second surface of the circuit connection board, wherein
   the circuit connection board has a first region, a second region, and a third region located between the first region and the second region; the second region 1 s closer to the PCBA than the first region, wherein
   the circuit connection board includes:
   a plurality of first pads disposed in the first region, wherein surfaces of the plurality of first pads facing away from the second surface are within the first surface; and
   a plurality of second pads disposed in the second region, wherein surfaces of the plurality of second pads facing away from the first surface are within the second surface;
   the at least one driver IC is located in the third region;
   the PCBA is bonded to the circuit connection board via the plurality of second pads;
   the PCBA is within the second region of the circuit connection board along a first direction;
   a boundary of the first region away from the second region is a first side surface of the circuit connection board;
   a boundary of the second region away from the first region is a second side surface of the circuit connection board;
   the second side surface is opposite to the first side surface; and
   the first direction is a direction from the first side surface to the second side surface or a direction from the second side surface to the first side surface;
   wherein the PCBA includes:
   a printed circuit board;
   a timing controller disposed on a surface of the printed circuit board facing the circuit connection board, wherein the timing controller is configured to convert an image data signal into a signal suitable for the driver IC and output the signal to the driver IC; and
   a power management integrated circuit (PMIC) disposed on the surface of the printed circuit board facing the circuit connection board, wherein the PMIC is configured to provide operating voltages.

2. The driving circuit board according to claim 1, wherein one side surface of the PCBA closest to the second side surface along the direction from the first side surface to the second side surface is flush with the second side surface.

3. The driving circuit board according to claim 1, wherein a distance from the first side surface of the circuit connection board to the second side surface of the circuit connection board along the first direction is in a range of approximately 15 mm to approximately 21 mm.

4. The driving circuit board according to claim 1, wherein the circuit connection board is a flexible printed circuit.

5. A display apparatus, comprising:
   a display panel, including an array substrate and a first substrate; and
   the driving circuit board according to claim 1 bonded onto a surface of the array substrate facing the first substrate.

6. The display apparatus according to claim 1, further comprising: a system main board electrically connected to the PCBA; and wherein the system main board is located at a side of the circuit connection board away from the PCBA in the thickness direction of the circuit connection board.

7. The display apparatus according to claim 5, wherein the display panel has a display region and a peripheral region, and the peripheral region includes a bonding region; and
   the display panel includes a plurality of bonding portions located in the bonding region, and the circuit connection board is electrically connected to the plurality of bonding portions through the plurality of first pads; and
   the second region and the third region of the circuit connection board are both located outside the display panel.

8. The display apparatus according to claim 5, wherein the display panel is a liquid crystal display (LCD) panel or an organic light-emitting diode (OLED) display panel.

9. The display apparatus according to claim 7, wherein along the first direction, a length of a portion of the circuit connection board that exceeds the display panel is in a range of approximately 14 mm to approximately 20 mm.

10. The display apparatus according to claim 8, wherein the display panel is the LCD panel, and the display apparatus further comprises a backlight module disposed at a side of the array substrate away from the first substrate in a thickness direction of the array substrate.

11. The display apparatus according to claim 10, wherein the backlight module includes a light source and a light guide plate, and the light source is located at a side face of the light guide plate along a direction perpendicular to a thickness direction of the light guide plate.

* * * * *